United States Patent
Ohba et al.

(10) Patent No.: US 6,779,164 B2
(45) Date of Patent: Aug. 17, 2004

(54) LSI DESIGN METHOD HAVING DUMMY PATTERN GENERATION PROCESS AND LCR EXTRACTION PROCESS AND COMPUTER PROGRAM THEREFOR

(75) Inventors: Hisayoshi Ohba, Kawasaki (JP); Jun Watanabe, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 77 days.

(21) Appl. No.: 10/032,498

(22) Filed: Jan. 2, 2002

(65) Prior Publication Data

US 2002/0184606 A1 Dec. 5, 2002

(30) Foreign Application Priority Data

Jun. 5, 2001 (JP) .......................................... 2001-169010

(51) Int. Cl.[7] .............................................. G06F 17/50
(52) U.S. Cl. ................................. 716/11; 716/8; 716/1
(58) Field of Search ................................... 716/11, 8, 1

(56) References Cited

U.S. PATENT DOCUMENTS 5,946,557 A * 8/1999 Hosoda et al. .............. 438/128
5,970,238 A * 10/1999 Shibata et al. .................. 716/8
6,441,456 B1 * 8/2002 Konishi et al. ............. 257/509
2002/0063335 A1 * 5/2002 Ozawa et al. ............... 257/758

FOREIGN PATENT DOCUMENTS

JP                 11111718       * 4/1999    ....... H01L/21/3205

* cited by examiner

Primary Examiner—Vuthe Siek
Assistant Examiner—Sun James Lin
(74) Attorney, Agent, or Firm—Arent Fox Kintner Plotkin & Kahn

(57) ABSTRACT

In the present invention, conductive dummy patterns continuous in a direction perpendicular to adjacent wiring patterns are inserted at a first distance from the adjacent wiring patterns between the adjacent wiring patterns extending in one direction, in an interconnection wiring layer in an LSI. The insertion of such dummy patterns makes it possible to suppress variations in the degree of pattern density in the interconnection wiring layer and suppress variations in the pattern width in the etching process. Furthermore, since the conductive dummy patterns are continuous in the direction perpendicular to the adjacent wiring patterns, the values of capacitance between the adjacent wiring patterns in the same wiring layer assume a constant value corresponding to the first distance, regardless of the distance between the adjacent wiring patterns.

16 Claims, 11 Drawing Sheets

FIG. 12

| LCR | Matching data | LCR value | Calculation |
|---|---|---|---|
| Ca (area) | d1 | Ca=xx (F/$\mu m^2$) | Ca × W × La |
| | d2 | Ca=yy | |
| | — | — | |
| | dn | Ca=zz | |
| Cc (coupling) | s1 | Cc=xx (F/$\mu m$) | Cc × La |
| | s2 | Cc=yy | |
| | — | — | |
| | sn | Cc=zz | |
| Cf (fringe) | sp1 | Cf=zz (F/$\mu m$) | Cf × La |
| | sp2 | Cf=yy | |
| | — | — | |
| | spn | Cf=zz | |
| R | 1st layer | Rs=xx ($\Omega/\Box$) | Rs × La/W |
| | 2nd layer | Rs=yy | |
| | — | — | |
| | nth layer | Rs=zz | |
| L | 1st layer | Ls=xx (H) | Ls × La/W |
| | 2nd layer | Ls=yy | |
| | — | — | |
| | nth layer | Ls=zz | |

LSI DESIGN METHOD HAVING DUMMY PATTERN GENERATION PROCESS AND LCR EXTRACTION PROCESS AND COMPUTER PROGRAM THEREFOR

BACKGROUND OF THE INVENTION

1. Field of the Invention

The present invention relates to a method for generating dummy patterns between the interconnection wiring patterns and extracting LCR in a design process of semiconductor integrated circuits (referred to as LSI hereinbelow) and to a computer program for execution thereof with a computer, and more particularly to an LSI design method which makes it possible to decrease a pattern density degree variation in the wiring layer and simplify the LCR extraction process and to a computer program therefor.

2. Description of the Related Art

An LSI design process is usually conducted by CAD with a computer. The LSI design process comprises a logic design process for designing a logic circuit by connecting the logic gates, a layout design process for laying out the logic circuit on a chip, a process for extracting the LCR (inductance, capacitance, resistance) of the laid-out interconnection wiring from the layout data, and for finding the signal path delay time from the extracted LCR values and AC characteristic of cells or macros, a logic simulation process for checking whether the logic circuit operates normally by using the delay time, and a physical inspection process for checking whether the layout data satisfy the design rule.

The layout design creates layout data containing wiring pattern data of each layer on the chip. The values of LCR of the interconnection wiring patterns are extracted based on the layout data. The LCR extraction process, delay time calculation process, and logic simulation process are usually provided in a single program module.

In the LCR extraction process, the resistance R, capacitance C, and inductance L are extracted by computation or by referring to a parameter table according to the wiring width, distance between the adjacent wirings or overlapping surface area contained in the layout table.

In the LCR extraction process, the distance to the adjacent interconnection wirings in the same wiring layer is extracted with respect to the object interconnection wiring, the capacitance value C corresponding to this distance is extracted, and the capacitance value corresponding to the adjacent interconnection wirings in different wiring layers is also extracted by referring to the layout data. Therefore, the LCR extraction process requires data processing with a comparatively heavy load.

On the other hand, due to recent pattern miniaturization, the width of the actually formed wiring pattern becomes different from the width of the wiring pattern in the layout data under the effect of fabrication processes. Etching of interconnection wiring patterns is one of the fabrication processes which apparently affects the wiring pattern width. In a reactive ion etching (RIE) process in which a reaction gas is introduced into a high-vacuum atmosphere, plasma is generated by applying a high frequency, and a wiring layer such as aluminum layer is etched, a pattern width variation effect can be observed in which the pattern width is decreased or increased due to the pattern miniaturization. Such changes in the pattern width caused by etching are generated in response to the degree of pattern density. Therefore, it is desired that the variations of the density degree be kept as small as possible.

A method of inserting a dummy pattern, which is not connected to any wiring pattern, in a region in which the distance between the wiring patterns is large, is used to decrease the variation of the pattern density degree in a wiring layer. However, because of the generation of dummy patterns, the extraction and computation of values of capacitance between the wiring layers become complex and the correct capacitance values are difficult to extract by simple data processing.

SUMMARY OF THE INVENTION

Accordingly, it is an object of the present invention to provide an LSI design method which can generate a dummy pattern without complicating the LCR extraction process and a computer program therefor.

Another object of the present invention is to provide a dummy pattern generation method which simplifies the LCR extraction process and a computer program therefor.

In order to attain the above-described object, in accordance with the first aspect of the present invention, conductive dummy patterns continuous in a direction perpendicular to adjacent wiring patterns are inserted at a first distance from the adjacent wiring patterns between the adjacent wiring patterns extending in one direction, in an interconnection wiring layer in an LSI. The insertion of such dummy patterns makes it possible to suppress variations in the degree of pattern density in the interconnection wiring layer and suppress variations in the pattern width in the etching process. Furthermore, since the conductive dummy patterns are continuous in the direction perpendicular to the adjacent wiring patterns, the values of capacitance between the adjacent wiring patterns in the same wiring layer assume a constant value corresponding to the first distance, regardless of the distance between the adjacent wiring patterns. Therefore, even in the case of different distances between the adjacent wiring patterns, the value of capacitance between the adjacent wiring patterns can be extracted as a constant value and the process for extracting the capacitance value C in the LCR extraction process is simplified.

In the preferred embodiment of the present invention, dummy patterns are generated over the entire surface in the interconnection wiring layer and then the dummy patterns present in the region within the first distance from the wiring patterns are removed. With such method, if the distance between the adjacent wiring patterns is confirmed to be no less than the doubled first distance, the dummy patterns separated form the wiring pattern by the first distance can be automatically generated without detecting the distance between the adjacent wiring patterns.

In another preferred embodiment of the present invention, the characteristic of capacitance between the adjacent wiring patterns comprises a first region where the value of capacitance between the adjacent wiring patterns greatly changes in response to changes in the distance of a dielectric between the adjacent wiring patterns and a second region where those changes are less than in the first region, and the first distance is selected as a minimum distance (strictly speaking, ½ of the minimum distance) in the second region.

By selecting the first distance between the wiring patterns and dummy patterns as a minimum distance (strictly speaking, ½ of the minimum distance) in the second region, it is possible to make the value of capacitance between the adjacent wiring patterns as small as possible and also to expand as much as possible the region where the degree of pattern density in the interconnection wiring layer is constant.

In another preferred embodiment of the present invention, the characteristic of capacitance between the adjacent wiring patterns comprises a first region where the value of capacitance between the adjacent wiring patterns greatly changes in response to changes in the distance of a dielectric between the adjacent wiring patterns and a second region where those changes are less than in the first region, and the first distance is selected as a predetermined distance (strictly speaking, ½ of the predetermined distance) in the first region.

When the distance between the adjacent wiring patterns is shorter than the minimum distance in the second region, the distance between the wiring patterns and dummy patterns is selected as a predetermined distance in the first region. As a result, because of the generation of dummy patterns, the value of capacitance between the adjacent wiring patterns can be made constant and the LCR extraction pattern can be simplified even when the distance between the adjacent wiring patterns is comparatively short.

In order to attain the above-described object, in accordance with the second aspect of the present invention, an LSI design method including a formation of wiring patterns in an interconnection wiring layer is provided, this method comprising:

a layout process for forming wiring patterns in the interconnection wiring layer from logic data containing a plurality of cells and connections thereof;

a dummy pattern generation process for inserting conductive dummy patterns continuous in the direction perpendicular to the wiring patterns between the wiring patterns, which are adjacent and extend in the same direction, at a first distance from the adjacent wiring patterns; and a capacitance extraction process for extracting a value of capacitance between the adjacent wiring patterns where the dummy pattern is generated as a capacitance value corresponding to the first distance.

BRIEF DESCRIPTION OF THE DRAWINGS

FIG. 12 illustrates an example of an LCR parameter table used in the LCR extraction process.

DESCRIPTION OF THE PREFERRED EMBODIMENTS

The embodiments of the present invention will be described below with reference to the drawings attached. However, the technological scope of the present invention is not limited to those embodiments and covers the invention described in the appended claims and equivalents thereof.

Figure 1:
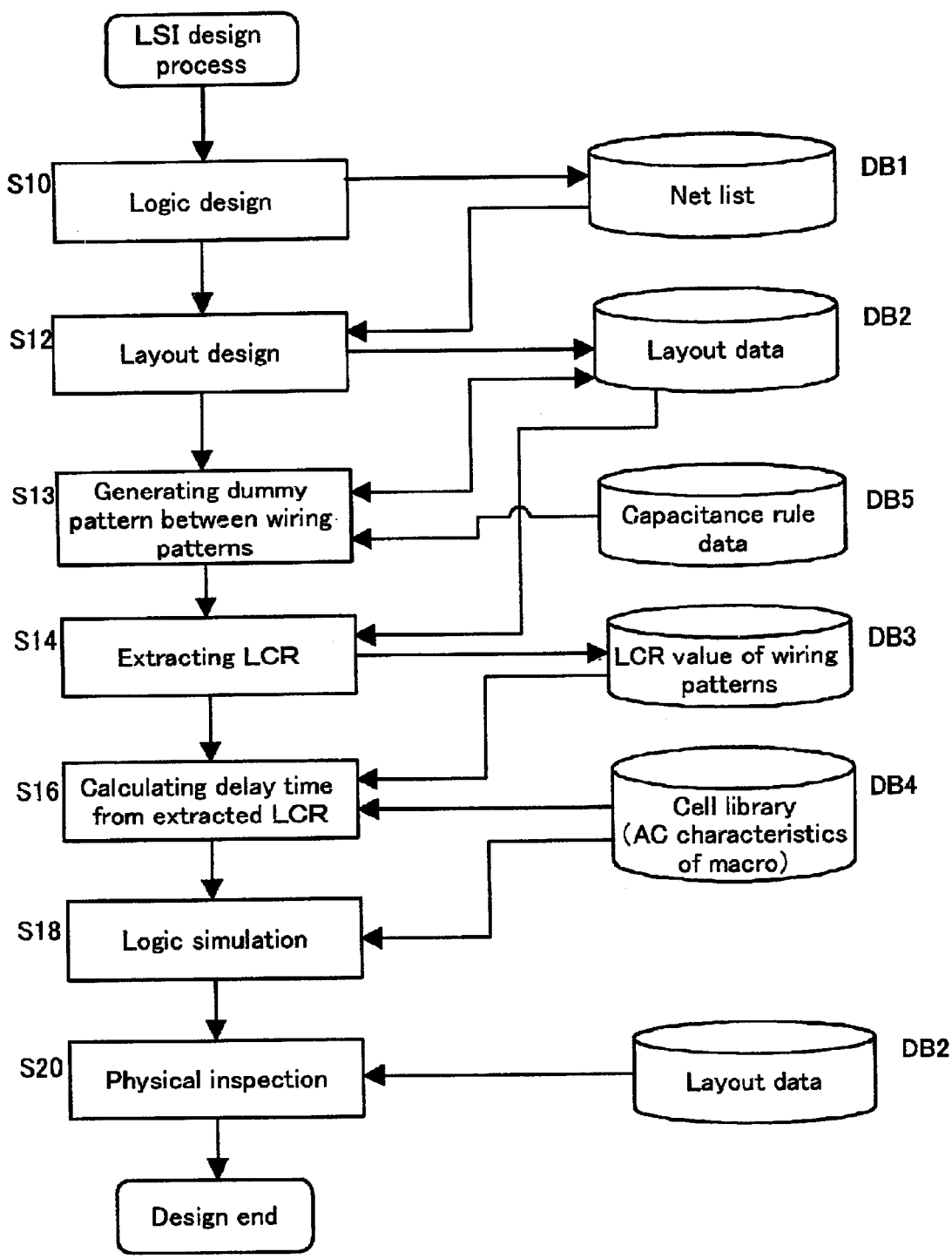
FIG. 1 is a flow chart illustrating the LSI design process in the preferred embodiment.

FIG. 1 is a flow chart diagram illustrating the LSI design process which is an embodiment of the present invention. As described above, the LSI design process comprises a logic design process (S10) for connecting logic gates and designing a logic circuit, a layout design process (S12) for laying out the logic circuit on a real chip, a process (S13) for generating a dummy pattern between the wiring patterns to the layout data, an LCR extraction process (S14) for extracting LCR (inductance, capacitance, resistance) values of the laid-out interconnection wirings from the layout data, a delay time calculation process (S16) for finding the delay time of a signal path according to the extracted LCR values and cell or macro AC characteristic, a logic simulation process (S18) for checking whether the logic circuit operates normally by using the delay time of the signal path, and a physical inspection process (S20) for checking whether the layout data satisfy the design rule.

Figure 2:
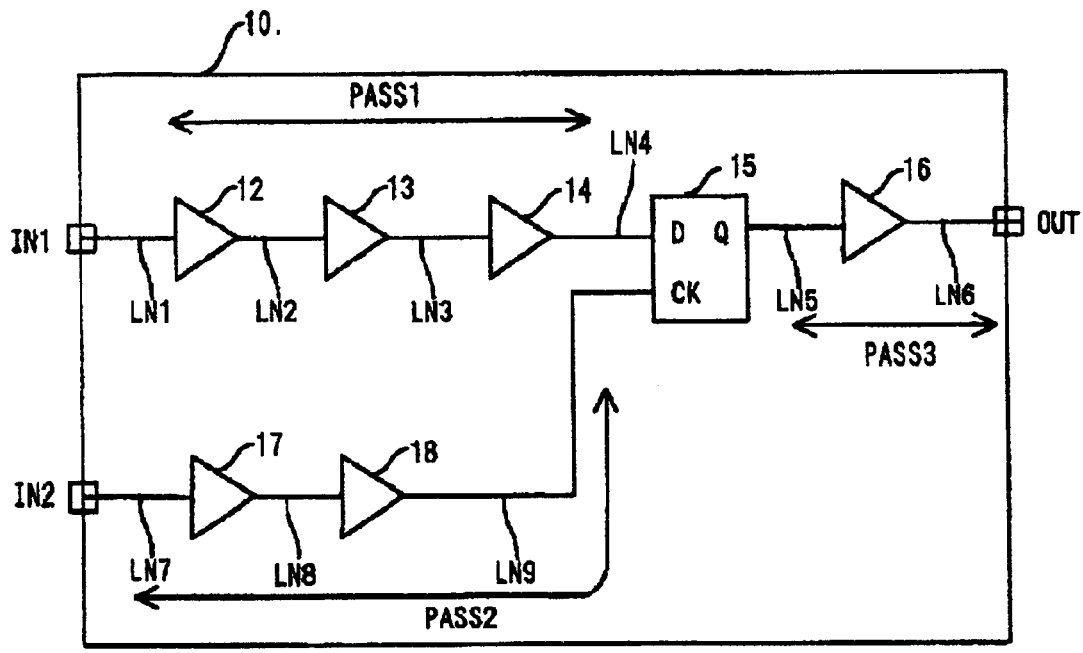
FIG. 2 illustrates an example of a logic circuit generated by a logic design.

In the logic design process S10, the designer uses a CAD tool to design a logic circuit implementing a certain function. As a result, a net list DB1 composed of a cell or macro having logic gates and connection data thereof is generated. When the logic design process is ended, a logic circuit shown in FIG. 2 is completed. This logic circuit can be specified by the net list DB1. In the example of logic circuit shown in FIG. 2, gates 12–14, 16–18 are connected to a flip-flop 15 between the input terminals IN1,2 and output terminal OUT in chip 10. The respective gates and flip-flop are connected by interconnection wirings LN1~LN9.

The layout design process S21 is conducted following the logic design process. Here, cells or macros are disposed on a real chip, the layout of the interconnection wiring pattern for connection thereof is conducted, and layout data DB2 are generated. When the interconnection wiring is implemented by multilayer wiring on a chip, the layout data DB2 for each interconnection wiring layer are generated. Therefore, the layout data DB2 have the data of the wiring pattern of interconnection wirings LN1~LN9 in the logic circuit shown in FIG. 2.

Figure 4:
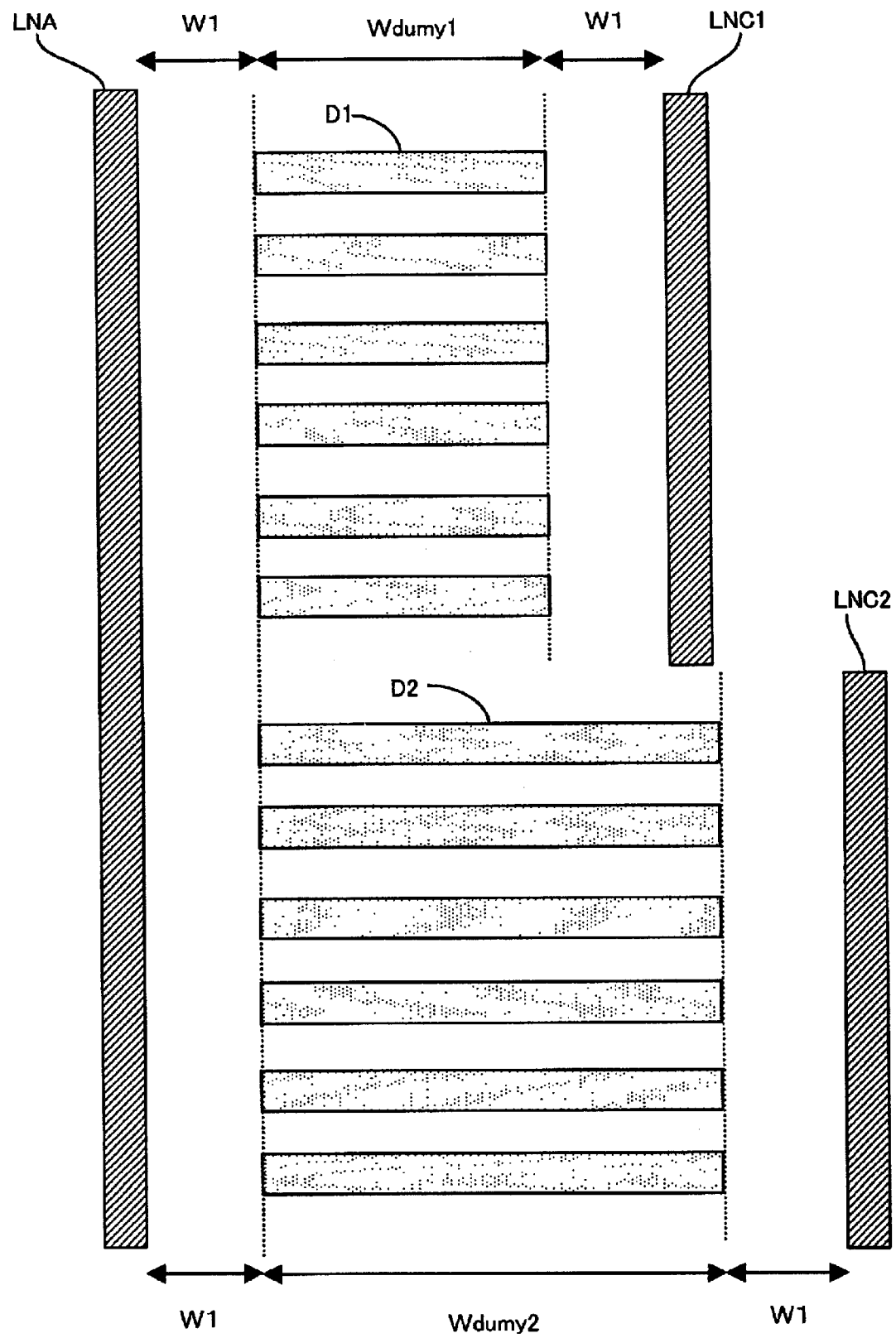
FIG. 4 illustrates an example of dummy patterns.

Then, in order to control as effectively as possible the degree of pattern density to a constant value with respect to the layout data, dummy patterns are generated in a region with a low pattern density and a comparatively large distance between the adjacent wiring patterns extending in the same direction. FIG. 4 shows an example of such dummy patterns. In the example shown in FIG. 4, conductive dummy patterns D1, D2 continuous in the direction perpendicular to the wiring patterns are inserted between the adjacent wiring patterns LNA and LNC1, 2 at a first distance W1 from the adjacent wiring patterns. The generation of the dummy patterns D1, D2 is conducted by performing data processing such that initially a plurality of strip-like conductive dummy patterns continuous in the direction perpendicular to the wiring patterns extending in the same direction are generated over the entire surface and then dummy patterns are removed from the region within the first distance W1 from the wiring patterns LNA and LNC1, 2. With such method, the dummy patterns can be formed in a position at a first distance W1, without regard for the distance between the adjacent wiring patterns.

As a result, the dummy patterns D1, D2 are a plurality of strip-like patterns extending between the wiring patterns LAN, LNC1, 2 in a region where is at a first distance W1 or more from the respective wiring patterns and between the adjacent wiring patterns LAN, LNC1, 2 extending in the same direction. Therefore, dummy patterns D1 with a comparatively small length Wdumy1 are generated in the lateral direction between the adjacent wiring patterns LNA, LNC1 that are less widely spaced, and dummy patterns D2 with a comparatively large length Wdumy2 are generated in the lateral direction between the adjacent wiring patterns LNA, LNC2 that are more widely spaced.

With such dummy pattern generation method, dummy patterns D1, D2 can be generated in a region at a first distance W1 from respective wiring patterns, regardless of the distance between the adjacent wiring patterns. As a result, the distance of a dielectric region between the adjacent wiring patterns is twice as large as the first distance W1, regardless of the distance between the wiring patterns, i.e. 2×W1, and the capacitance value between the adjacent wiring patterns is $C=\epsilon S/2W1$ corresponding to the distance 2×W1. This capacitance value clearly demonstrates that the conductive dummy patterns are normally in an electric floating state and are different in this respect from the wiring patterns.

Various values can be selected for the first distance prohibiting the generation of dummy pattern; those values will be described below in greater detail. No matter what distance was selected, the capacitance value between the adjacent wiring patterns can be made constant, regardless of the distance between the adjacent wiring patterns.

Then, at least one value of resistance, capacitance and inductance of the interconnection wirings LN1~LN9 is extracted based on the layout data DB2 (S14). Specific method for such LCR extraction is described below. Because the capacitance value between the adjacent wiring patterns in the same interconnection wiring layer can be made constant, regardless of the distance between the wiring patterns, the capacitance value between the adjacent wiring patterns can be easily extracted during LCR extraction because of the above-described generation the dummy patterns.

The signal propagation delay time of signal path PASS 1~3 is then calculated (S16) based on the extracted LCR value data DB3 of interconnection wirings and the AC characteristic of cells or macros in a cell library DB4. This AC characteristic of cells or macros, for example, in case of an inverter, is an output fall vs. input rise characteristic, an output drive capability and the like.

Figure 3:
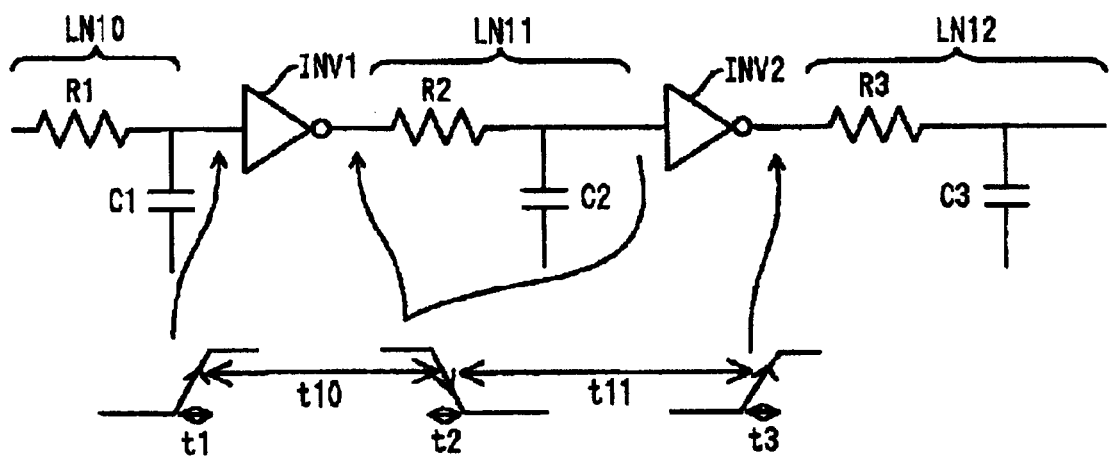
FIG. 3 explains a calculation of a signal propagation delay time in a signal path.

FIG. 3 explains the calculation of the signal propagation delay time of a signal path. In this example, the inverters INV1, INV2 are connected in series. In this case, an interconnection wiring LN10 composed of resistor R1, capacitance C1 is connected to the input terminal of the first-stage inverter INV1. This interconnection wiring LN10 is driven by the previous-stage gate (not shown), and the input signal of inverter INV1 is a rising waveform having a delay time t1. The delay time t1 of this rising waveform can be determined from the drive capability of the previous stage gate and resistance R1, capacitance C1 of interconnection wiring LN10.

In inverter INV1, the output falls with a delay by a constant delay time t10 with respect to the rising waveform of input. The output fall characteristic depends on resistance R2 and capacitance C2 of the connection line LN 11 connected to the output terminal and on the output drive capability of inverter INV1. Similarly, in inverter INV2 of the next stage, too, the output rises with a delay by a constant delay time t11 with respect to the falling waveform of input. This output rising characteristic t3 is also determined by the drive capability of inverter INV2 and resistance R3 and capacitance C3 of the line connected to the output.

Thus, the signal propagation delay time can be successively calculated along the signal path from the LCR values of the connection line and AC characteristic of the cells. As a result, in the example of logic circuit shown in FIG. 2, the respective signal propagation delay time of signal paths PASS1, 2, 3 can be determined. If the inductance of the connection line is extracted, the delay characteristic caused by the inductance can be also included in the signal propagation delay time of signal paths.

If the signal propagation delay time of signal paths is obtained, logic simulation is conducted with respect to the logic circuit in order to check whether the normal operation is performed (S18). The logic simulation checks whether the logic circuit operates normally in response to the test input data and whether the expected test output data are output. In this case, in the example shown in FIG. 2, the signal propagation delay times of signal paths are employed to check whether the clock input timing to the clock terminal CK of flip-flop 15 matches the data input timing to the data input terminal D. Thus, the data input D should be maintained at a correct level between the setup time and hold time before and after the rise timing of clock CK. The delay time of signal paths PASS1, 2 should be appropriately calculated to conduct such check.

The LSI design process was schematically described above. The dummy pattern generation process and LCR extraction process in the following preferred embodiment will be described below.

Figure 5:
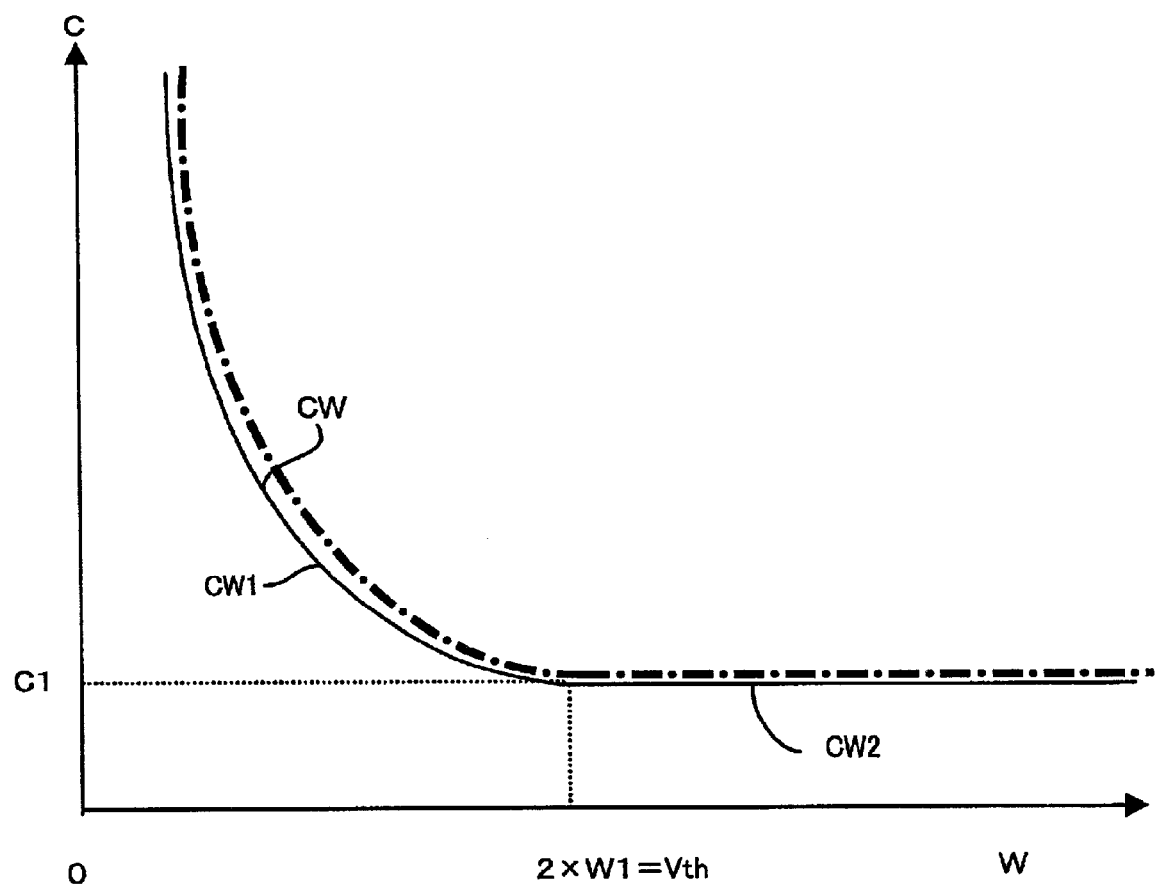
FIG. 5 illustrates the first example of dummy pattern generation.

FIG. 5 illustrates a first example of dummy pattern generation. The distance W between wiring patterns (or thickness of a dielectric between the wiring patterns) is plotted against the abscissa, and the capacitance C between the wiring patterns is plotted against the ordinate. Capacitance C between the adjacent wiring patterns in the interconnection wiring layer is determined as $C=\epsilon S/W$, where W is the distance of a dielectric between the adjacent wiring patterns and S is the area of the opposite surfaces of the wiring patterns. In other words, the capacitance C between the adjacent wiring patterns is inversely proportional to distance W; this relationship being represented by a solid line CW in FIG. 5. The solid line CW comprises a first region CW1 where the capacitance C greatly decreases with the increase in the distance W between the wiring patterns from zero to Vth and a second region CW2 where the decrease in capacitance C in response to increase in the distance W between the wiring patterns to above Vth is extremely small.

Consideration of this relationship between capacitance C and distance W between the wiring patterns demonstrates that by making the distance W1 between the wiring patterns LNA, LNC1, 2 shown in FIG. 4 and the dummy patterns D1, D2 half of the shortest distance Vth in the second region, it is possible to generate dummy patterns in positions at a distance of Vth/2 from the wiring patterns for as many wiring patterns in the interconnection wiring layer as possible. As a result, the degree of pattern density can be made the same in a wider region in the interconnection wiring layer, and when the distance between the adjacent patterns exceeds Vth, the capacitance C between those adjacent wiring patterns can be matched with the same value. This is because inserting the conductive dummy patterns between the adjacent wiring patterns matches the thickness of dielectric with thickness Vth. For this reason, data process in the below-described wiring pattern LCR extraction process can be reduced.

However, when the distance between the adjacent wiring patterns is less than Vth, the capacitance value C corresponding to the respective distance between wiring patterns has to be extracted from the below described parameter table of LCR values by matching the layout pattern with the parameter table of LCR values. Such data processing demands a high-load processing, but since the number of wiring patterns requiring such data processing is limited, the load of data processing in the LCR extraction process can be reduced by comparison with the conventional one.

Figure 6:
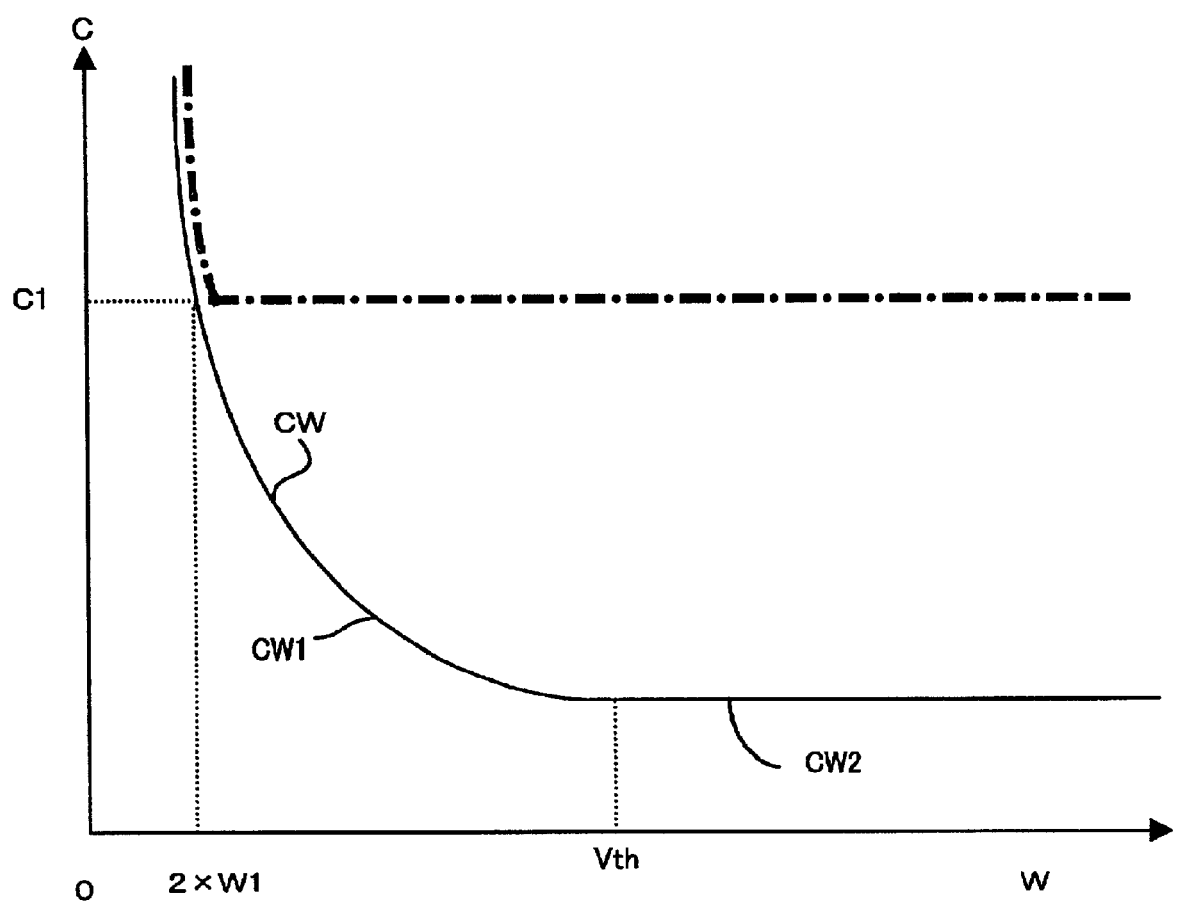
FIG. 6 illustrates the second example of dummy pattern generation.

With the above-described dummy pattern generation, if the distance between the adjacent wiring patterns exceeds Vth, dummy patterns are generated and the capacitance between the wiring patterns in this case assumes a constant value C1, as shown by a dot-and-dash line. When the distance between the wiring patterns exceeds Vth, even if the distance between the dummy patterns and the adjacent wiring patterns further increases, the decrease in the capacitance value is insignificant. Moreover, such increase, conversely, brings about the following negative results: variations in the degree of pattern density are increased, the number of wiring patterns that require matching in the LCR extraction process is increased, and the load on data processing in the extraction process becomes heavier. Therefore, when the distance between the adjacent wiring patterns exceeds Vth, it is preferred that the dummy patterns be uniformly generated in positions at a constant distance of W1=Vth/2 so that the variations in the degree of pattern density be suppressed and a constant capacitance value be obtained. Furthermore, if the distance between the adjacent patterns is no more than Vth, no dummy patterns are generated. Therefore, the capacitance value between the adjacent wiring patterns changes inversely proportional to the distance between the wiring patterns, as shown by a dot-and-dash line FIG. 6 illustrates a second example of dummy pattern generation. In this figure, too, the distance W between the wiring patterns (or thickness of a dielectric region between the wiring patterns) is plotted against the abscissa, and the capacitance C between the wiring patterns is plotted against the ordinate. The relationship between the distance W between the wiring patterns and capacitance value C also has the first region CW1 and second region CW2. In the second example, the distance between the wiring patterns and dummy patterns is 2×W1 which is shorter than the distance Vth in the first example.

Thus when the distance W between the adjacent wiring patterns is greater than 2×W1, the dummy patterns are generated in the positions at a distance W1 from the wiring patterns, as shown in FIG. 4, and when the distance between the wiring patterns is not longer than 2×W1, no dummy pattern is generated. Accordingly, the dummy pattern is generated and the degree of pattern density is made the same in a wider region than in the first example. Moreover, the capacitance value between the wiring patterns in the LCR extraction process can be brought to a constant value C1 for a larger number of wiring patterns.

In this case, as shown by the dot-and-dash line of capacitance value C in the figure, the capacitance value C1 obtained when the distance between the adjacent wiring patterns is greater than 2×W1 is higher than that in the first example, the crosstalk influence increases, and the signal propagation delay time becomes long. Therefore, the distance 2×W1 is selected which corresponds to the capacitance value C1 in the allowable range.

Figure 7:
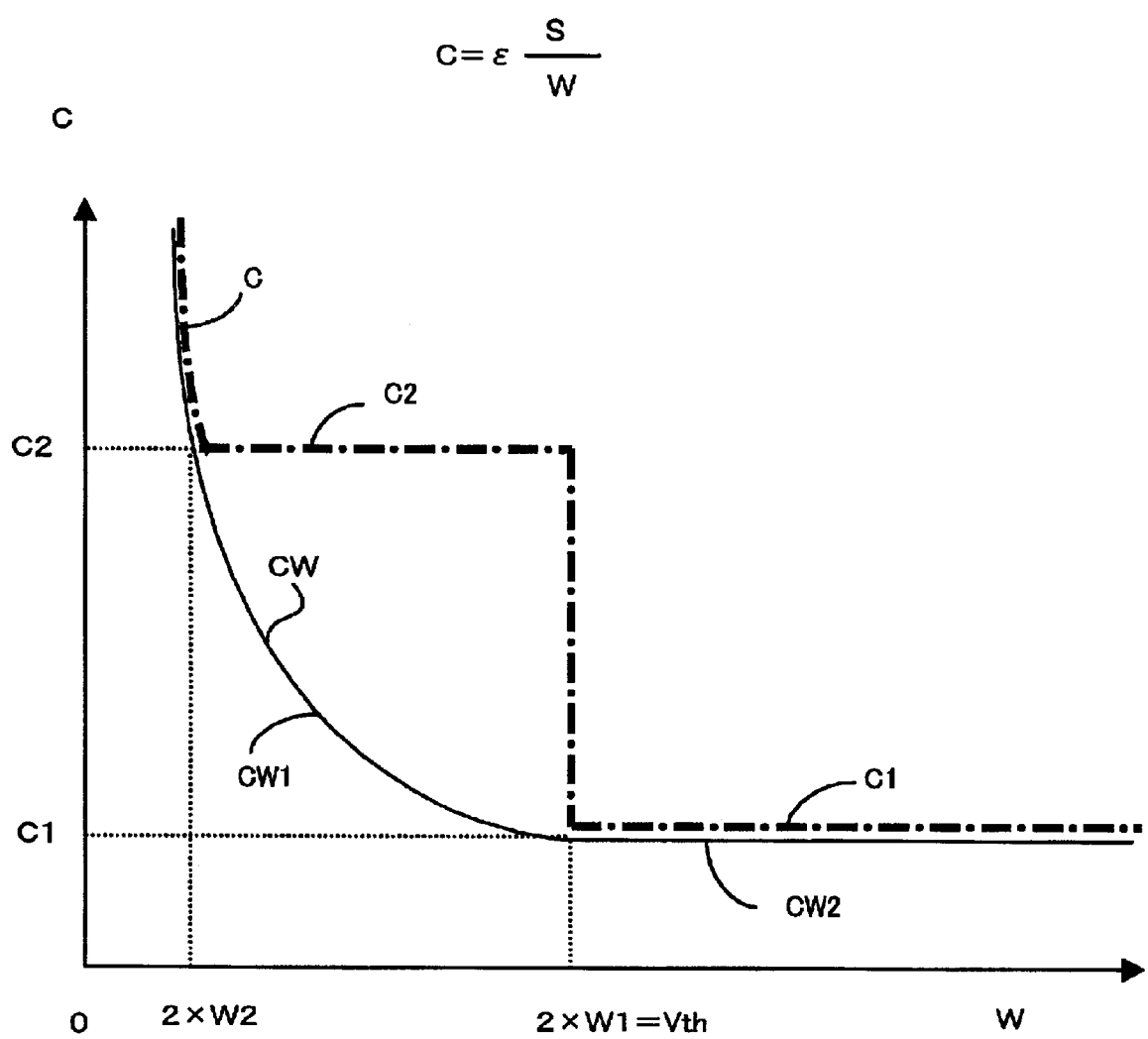
FIG. 7 illustrates the third example of dummy pattern generation.
Figure 8:
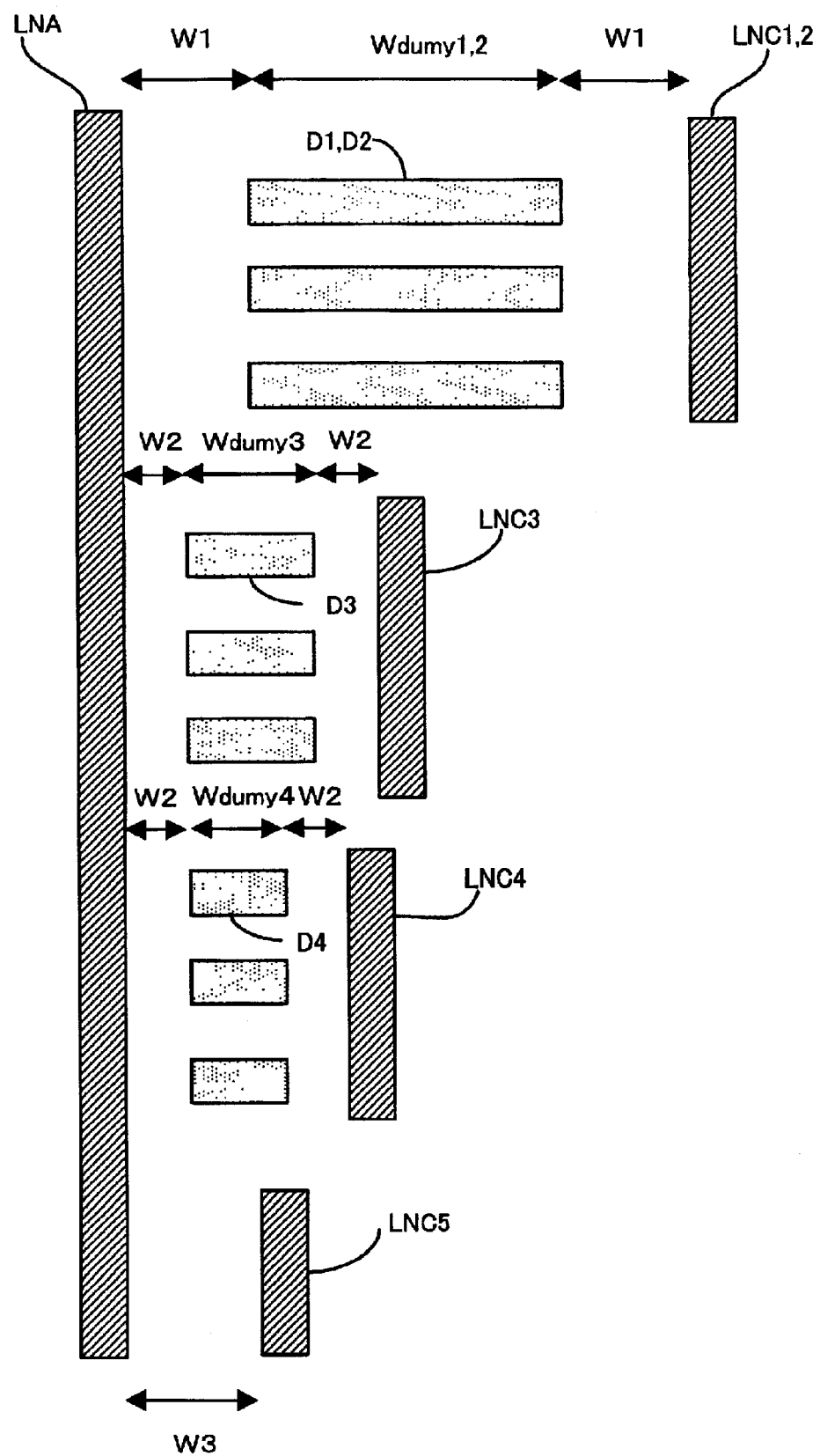
FIG. 8 illustrates dummy patterns of the third example.

FIG. 7 illustrates the third example of dummy pattern generation. FIG. 8 shows the dummy pattern of the third example. This example combines the first and second examples.

In the third example, when the distance Vth between the adjacent wiring patterns exceeds Vth, as in the case of wiring patterns LNA, LNC1,2 in FIG. 8, the dummy patterns D1, D2 are generated in the positions separated from the respective wiring patterns by the first distance W1 (=Vth/2). This is identical to the first example. The first distance W1 which is half of the minimum distance Vth in the second region CW2 in the relationship between the distance W of the wiring patterns and capacitance C is selected as the distance between the wiring patterns and dummy patterns. Therefore, the capacitance value between the wiring patterns in this case becomes a constant value C1.

Then, when the distance between the adjacent wiring patterns is between the prescribed distance 2×W2 and the distance Vth (2×W1) in the first region CW1, as in the case of wiring patterns LNA, LNC3, 4, the dummy patterns D3, D4 are generated in the positions separated from the respective wiring patterns by the second distance W2. This is identical to the second example, and the capacitance value between the wiring patterns in this case becomes a constant value C2.

Finally, when the distance between the adjacent wiring patterns is less than the prescribed distance 2×W2, as in the case of wiring patterns LNA, LNC5, no dummy pattern is generated. Therefore, the capacitance value between the adjacent wiring patterns in this case is a C value which is inversely proportional to both distances W.

Thus, with the dummy pattern generation method of the third example, when the distance between the adjacent wiring patterns is short, no dummy pattern is generated and the capacitance assumes a value inversely proportional to the distance, but when the distance between the adjacent wiring patterns is wide, the dummy patterns of a plurality of types are generated between the wiring patterns. Moreover, since those dummy patterns are separated by the predetermined first distance W1 or W2 from the wiring patterns, the respective capacitance values assume the predetermined values C1 or C2. Therefore, the process of extracting the values of capacitance between the adjacent wiring patterns in the LCR extraction process is simplified.

With the third example, the distance from the wiring patterns as the dummy pattern generation prohibition region is set in two stages of W1, W2, but it may also be set in 3 stages and 4 stages. For example, in a 3-stage case, the predetermined distance between the distances W1 and W2 is preferably selected. This is because no significant contribution is made to the reduction of capacitance value even if the distance is longer than distance W1.

Figure 9:
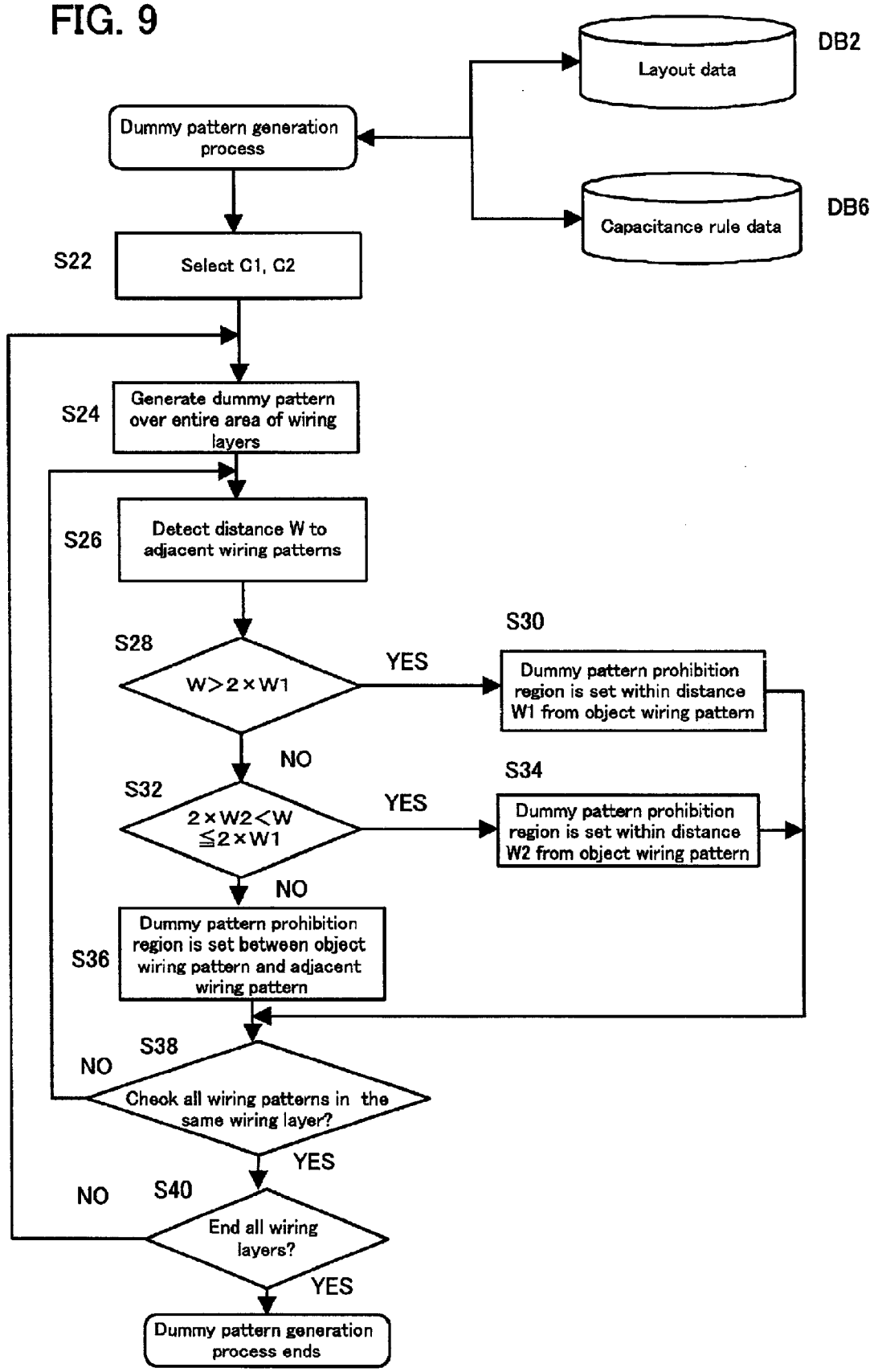
FIG. 9 is a flow chart of a dummy pattern generation process.

FIG. 9 is a flow chart of the dummy pattern generation process. This flow chart illustrates a process for the implementation of the above-descried third dummy pattern generation example. This dummy pattern generation process, as shown in FIG. 1, is conducted after the layout design process S12 with reference to the layout data DB2 and the capacitance rule data DB6. The capacitance rule data DB6 are data on characteristic CW representing the relationship between the distance W between the wiring patterns and the capacitance value C shown in FIGS. 5, 6, and 7.

Initially, capacitance values C1, C2 for a case when the distance between the adjacent wiring patterns is no less than constant are determined according to LSI design specifications (process S22). The capacitance values C1, C2 are determined by taking into account the delay characteristic of LSI circuit or a crosstalk characteristic. Distances W1, W2 prohibiting the generation of dummy patterns from the wiring patterns are determined by the capacitance rule data DB6 according to the capacitance values C1, C2.

Then, the dummy pattern generation program generates strip-like dummy patterns in the direction perpendicular to the extending direction of the wiring patterns over the entire surface in all of the interconnection wiring layers (process S24). In all of the interconnection wiring layers, the extending direction of the wiring patterns is usually set to the X direction or Y direction. Therefore, the continuous strip-like conductive dummy patterns are preferably generated in the direction perpendicular to those directions.

Then, the distance to the adjacent wiring patterns is detected for the object wiring pattern with reference to layout data DB2 (process S26). The detection of this distance is preferably conducted for each unit length of the object wiring pattern.

When the distance W to the adjacent wiring pattern exceeds the doubled first distance W1, the region within the first distance W1 from the object wiring pattern is considered as a dummy pattern prohibition region and the dummy pattern present in this region is deleted (processes S28, S30). Furthermore, when the distance W to the adjacent wiring patterns is no more than the doubled first distance W1 and more than the doubled second distance W2, the region within the second distance W2 from the object wiring pattern is considered as a dummy pattern prohibition region and the dummy pattern present in this region is deleted (processes S32, S34).

Furthermore, when the distance W to the adjacent wiring patterns is no more than the doubled second distance W2, the entire region therebetween is considered as a dummy pattern prohibition region and the entire dummy pattern present in this region is deleted (processes S36). The aforesaid processes S26~S36 are conducted along the entire length per unit length of the object wiring pattern. Moreover, they are conducted with respect to the entire wiring patterns in the same interconnection wiring layer (process S38).

The detection (S28) of whether the distance W to the adjacent wiring patterns exceeds the doubled first distance W1 is conducted with respect to the object wiring pattern, for example, by retrieving the layout data of the same interconnection wiring layer and checking whether a separate wiring pattern is present in the position separated by the distance W1 from the object wiring pattern. Such retrieval is required because the layout data are usually an assembly of each pattern coordinate data. The detection (S32) of whether the distance W to the adjacent wiring patterns is no more than the doubled first distance W2 is also conducted by similar retrieval.

Once the above-described dummy pattern generation process is completed for the all interconnection wiring layers (process S40), the dummy pattern generation process is completed. As a result, the dummy pattern is recorded in the layout data DB2 in addition to the wiring pattern.

If this dummy pattern generation process is completed, then dummy patterns of two types are generated between the adjacent wiring patterns according to the spacing therebetween, as shown in FIG. 8. Furthermore, when the distance between the adjacent wiring patterns is short, no dummy pattern is generated.

Figure 10:
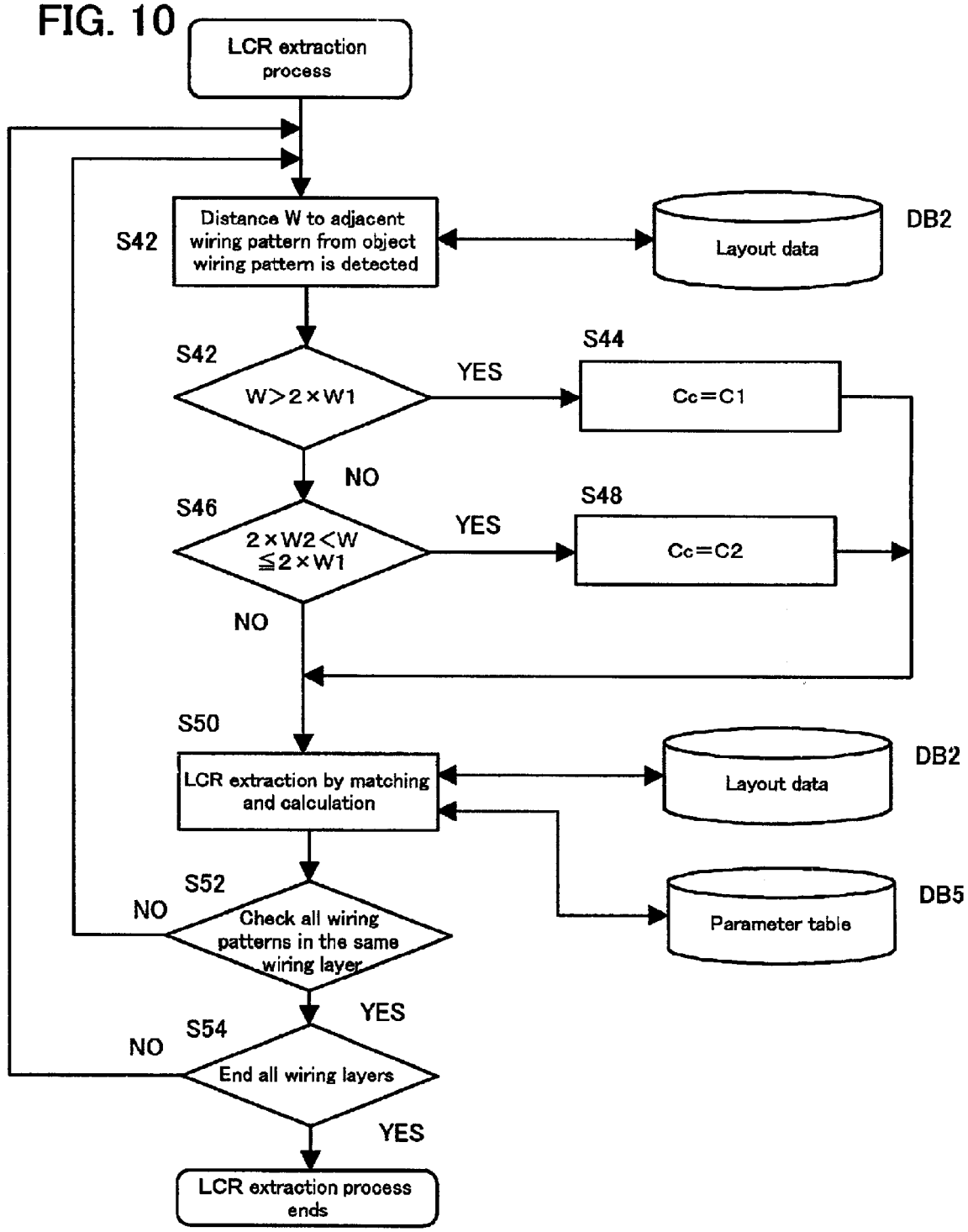
FIG. 10 is a flow chart of an LCR extraction process.
Figure 11:
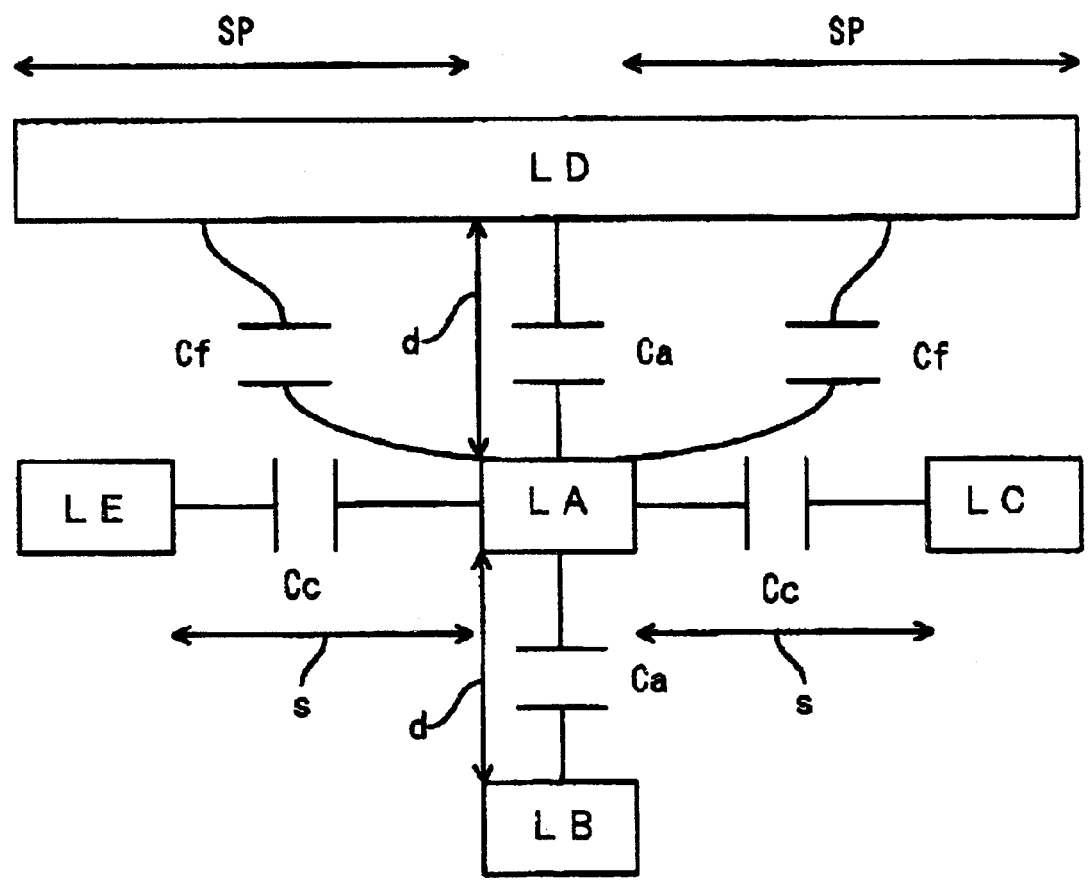
FIG. 11 is a cross sectional view explaining the LCR extraction.

FIG. 10 is a flow chart of the LCR extraction process. FIG. 11 is a cross section illustrating the LCR extraction. In the cross section shown in FIG. 11, the object wiring pattern LA, adjacent wiring patterns LC, LE located in the same connection wiring layer, wiring pattern LD of the upper layer, and wiring pattern LB of the lower layer are shown. The capacitance value of the object wiring pattern LA is a sum of the parasitic capacities Ca, Cc, Cf with the wiring patterns LB~LE surrounding the object wiring pattern.

Thus, the wiring pattern LB generates an area capacitance Ca with respect to the object wiring pattern LA and the value of this area capacitance Ca depends on the thickness d of the insulation film between the wiring patterns LA, LB and the mutual overlapping surface area. Furthermore, the wiring patterns LC, LE are separated from the object wiring pattern LA by a pattern spacing s (space) and generate a coupling capacitance Cc. This coupling capacitance Cc changes depending on the pattern spacing s and also changes depending on the thickness and length of the object wiring pattern LA.

Furthermore, the fringe portions SP on both sides of the wiring pattern LD face the object wiring pattern LA and generate a fringe capacitance Cf. The value of the fringe capacitance Cf changes depending on the length SP of the fringe portion and also changes depending on the length of the object wiring pattern LA.

The resistance R and inductance L of the object wiring pattern LA are different for each wiring layer and differ depending on the pattern width or length of the object wiring pattern LA itself. Thus, the resistance R or inductance L can be found from the data of the object wiring pattern LA itself, but the capacitance C cannot be found unless the distance to the adjacent wiring pattern or size is detected.

Thus, when the LCR values of the object wiring pattern are extracted, the resistance R, inductance L, and capacitance C can be found by computations according to the layout data. However, such computation requires huge computer time and is not practical. Accordingly, in the present embodiment, the parameter table of LCR values is created in advance and the LCR values are determined with reference to this table, thereby shortening the computation time of computer.

FIG. 12 illustrates an example of an LCR parameter table used in the LCR extraction process. For example, in case of area capacitance Ca, the correspondence is established with capacitance xx, yy, zz per unit area relating to the insulating film thickness d of n types. Therefore, the insulating film thickness d in the layout data DB2 is matched with the film thickness d1~dn of n types in the parameter table, and the area capacitance Ca (F/$\mu$m$^2$) per unit area corresponding to the respective film thickness di (i=1~n) is extracted. This area capacitance Ca per unit area is a parameter for finding the area capacitance and can be found in advance. The area capacitance Ca of the object wiring pattern LA can be found by multiplying the extracted area capacitance Ca per unit area by the pattern width W and length (length in the direction perpendicular to a sheet surface in FIG. 11) La of the object wiring pattern LA. Thus, since the calculation of area capacitance Ca per unit area is completed in advance, the computation time of computer in the LCR extraction process can be shortened.

In case of coupling capacitance Cc, the correspondence is established with the capacitance per unit length relating to the pattern spacing s of n types. Therefore, the pattern spacing in the layout data DB2 is matched against the pattern spacing s1~sn of n types in the parameter table, and the respective coupling capacitance Cc (F/$\mu$m) per unit length is extracted. The coupling capacitance Cc of the object wiring pattern LA can be found by multiplying the extracted coupling capacitance Cc per unit length by the length La of the object wiring pattern LA.

In case of fringe capacitance cf, the correspondence is established with the capacitance per unit length relating to a fringe length sp1~spn of n types of wiring pattern LD. The fringe length in the layout table DB2 is matched with the fringe length sp1~spn of n types in the parameter table, and the respective coupling capacitance Cc per unit length is extracted. The fringe capacitance Cf is found by multiplying the extracted value by the length La of the object wiring pattern LA.

As for resistance R, the sheet resistance Rs of each wiring layer of the chip is recorded in advance in the parameter table. Therefore, the sheet resistance Rs corresponding to the number of the wiring layers in the layout table DB2 is extracted and the resistance R of pattern LA is found by multiplying the extracted value by the length La of the object wiring pattern LA and dividing by the pattern width W. The inductance L also can be found by the same method as resistance R.

As described above, the insulating film thickness d, pattern spacing s, and fringe length sp of adjacent patterns contained in the layout table DB2 are matched against the same parameters in the parameter table DB5, and the unit capacities Ca, Cc, Cf, sheet resistance Rs, and inductance Ls corresponding to the matched ones are extracted. Actual values of capacitance, resistance, and inductance are found from the pattern width or length of the object wiring pattern LA.

The LCR extraction process in the preferred embodiment will be explained below with reference to FIG. 10. First, the layout table DB2 is retrieved and the distance W to the adjacent wiring pattern from the object wiring pattern is detected (process S42). If the distance W exceeds the doubled first distance W1, the respective coupling capacitance Cc is determined as C1 (processes S42, S44). Furthermore, when the distance W is no more than the doubled first distance W1 and exceeds the doubled second distance W2, the respective coupling capacitance Cc is determined as C2 (processes S46, S48). Those processes S42, S46 are conducted by retrieving the layout data DB2, similarly to processes S46, S48 implemented in the dummy pattern generation process illustrated by FIG. 9. Thus, it is suffice to detect whether an adjacent wiring pattern exists in the position separated from the object wiring pattern by the first distance W1 or less, and the retrieval process can be substantially shortened by comparison with the retrieval of the entire region in the same wiring layer.

When the distance W is no more than the doubled second distance W2, in process S50, the coupling capacitance Cc of the object wiring pattern is found by referring to the parameter table DB5 based on the matching data s in the layout table DB2. Furthermore, in this matching process, the resistance R and inductance L of the object wiring pattern are found by referring to the parameter table DB5 based on the matching data d, sp in the layout table DB2. However, the number of wiring patterns requiring such matching process is greatly reduced by the generation of dummy pattern.

The above-described processes S42~S50 are repeated for the all object wiring patterns in the same interconnection wiring layer (process S52) and further also repeated for the all interconnection wiring layers (process S54).

In the above-described LCR extraction process, following the generation of a dummy pattern, the coupling capacitance Cc is determined in advance in case of a constant distance between the wiring patterns, and the extraction process S50 of coupling capacitance Cc by matching can be shortened significantly. As a result, the computation time of computer in the LSI design process can be shortened.

In the flow chart shown in FIG. 1, the dummy pattern generation process is conducted directly after the layout design process, but it may be conducted at any stage after the layout design process.

As described in the foregoing, in accordance with the present invention, the generation of dummy patterns makes it possible to decrease variations in the degree of pattern density in the interconnection wiring layer and simplify the process of extracting values of capacitance between the adjacent wiring patterns.

What is claimed is:

1. An LSI design method including a formation of wiring patterns in an interconnection wiring layer, the method comprising:

a layout process for forming a wiring pattern in the interconnection wiring layer from logic data including a plurality of cells and connections thereof;

a dummy pattern generation process for inserting conductive dummy patterns continuous in the direction perpendicular to said wiring patterns between said wiring patterns, said wiring patterns being adjacent and extending in the same direction, at a first distance from said adjacent wiring patterns; and a capacitance extraction process for extracting a value of capacitance between said adjacent wiring patterns where said dummy pattern is generated as a capacitance value corresponding to said first distance.

2. The LSI design method according to claim 1, wherein said dummy pattern generation process comprises a process for generating a dummy pattern over the entire area in said interconnection wiring layer and then removing the dummy pattern present in the region within the first distance from the wiring patterns.

3. The LSI design method according to claim 1, wherein a characteristic of capacitance between said adjacent wiring patterns includes a first region where the value of capacitance between the adjacent wiring patterns greatly changes in response to changes in a distance of a dielectric region between the adjacent wiring patterns and a second region where the value of capacitance changes are less than in the first region, and in said dummy pattern generation process, said first distance is selected as a value corresponding to a minimum distance in said second region.

4. The LSI design method according to claim 1, wherein a characteristic of capacitance between said adjacent wiring patterns includes a first region where the value of capacitance between the adjacent wiring patterns greatly changes in response to changes in a distance of a dielectric region between the adjacent wiring patterns and a second region where the value of capacitance changes are less than in the first region, and in said dummy pattern generation process, the first distance is selected as a value corresponding to a predetermined distance in said first region.

5. The LSI design method according to claim 1, wherein a characteristic of capacitance between said adjacent wiring patterns includes a first region where the value of capacitance between the adjacent wiring patterns greatly changes in response to changes in a distance of a dielectric region between the adjacent wiring patterns and a second region where the value of capacitance changes are less than in the first region; and wherein, in said dummy pattern generation process, the first distance is selected as a value corresponding to a minimum distance in said second region and a predetermined distance in said first region; and in said capacitance extraction process, when a distance between said wiring patterns and dummy patterns is selected as a value corresponding to said minimum distance, a first capacitance value corresponding to said minimum distance is extracted, and when the distance between said wiring patterns and dummy patterns is selected as a value corresponding to said predetermined distance, a second capacitance value corresponding to said predetermined distance is extracted.

6. The LSI design method according to claim 4 or 5, wherein, in said dummy pattern generation process, the generation of dummy pattern is not conducted when a distance between said adjacent wiring patterns is not more than the doubled said predetermined distance; and wherein, in said capacitance extraction process, the capacitance value corresponding to the distance between the adjacent wiring patterns is extracted for the wiring patterns for which no dummy pattern was generated.

7. The LSI design method according to claim 1, wherein in said dummy pattern generation process, the generation of dummy pattern is not conducted when a distance between said adjacent wiring patterns is not more than the doubled said first distance, and in said capacitance extraction process, the capacitance value corresponding to the distance between the adjacent wiring patterns is extracted for the wiring patterns for which no dummy pattern was generated.

8. An LSI design computer program for executing in a computer an LSI design process including a formation of wiring patterns in an interconnection wiring layer, the LSI design process comprising:

a layout process for forming a wiring pattern in the interconnection wiring layer from logic data including a plurality of cells and connections thereof;

a dummy pattern generation process for inserting conductive dummy patterns continuous in the direction perpendicular to said wiring patterns between said wiring patterns, said wiring patterns being adjacent and extending in the same direction, at a first distance from said adjacent wiring patterns; and a capacitance extraction process for extracting a value of capacitance between said adjacent wiring patterns where said dummy pattern is generated as a capacitance value corresponding to said first distance.

9. The LSI design computer program according to claim 8, wherein said dummy pattern generation process comprises a process for generating a dummy pattern over the entire area in said interconnection wiring layer and then removing the dummy pattern present in the region within the first distance from the wiring patterns.

10. The LSI design computer program according to claim 9, wherein a characteristic of capacitance between said adjacent wiring patterns includes a first region where the value of capacitance between the adjacent wiring patterns greatly changes in response to changes in a distance of a dielectric region between the adjacent wiring patterns and a second region where the value of capacitance changes are less than in the first region, and in said dummy pattern generation process, said first distance is selected as a value corresponding to a minimum distance in said second region.

11. The LSI design computer program according to claim 9, wherein a characteristic of capacitance between said adjacent wiring patterns includes a first region where the value of capacitance between the adjacent wiring patterns greatly changes in response to changes in a distance of a dielectric region between the adjacent wiring patterns and a second region where the value of capacitance changes are less than in the first region, and in said dummy pattern generation process, the first distance is selected as a value corresponding to a predetermined distance in said first region.

12. The LSI design computer program according to claim 9, wherein a characteristic of capacitance between said adjacent wiring patterns includes a first region where the value of capacitance between the adjacent wiring patterns greatly changes in response to changes in a distance of a dielectric region between the adjacent wiring patterns and a second region where the value of capacitance changes are less than in the first region; and wherein, in said dummy pattern generation process, said first distance is selected as a value corresponding to a minimum distance in said second region and a predetermined distance in said first region; and in said capacitance extraction process, when a distance between said wiring patterns and dummy patterns is selected as a value corresponding to said minimum distance, a first capacitance value corresponding to said minimum distance is extracted, and when the distance between said wiring patterns and dummy patterns is selected as a value corresponding to said predetermined distance, a second capacitance value corresponding to said predetermined distance is extracted.

13. A semiconductor device comprising:

a plurality of wiring patterns formed in an interconnection wiring layer, said wiring patterns being adjacent and extending in the same direction; and conductive dummy patterns inserted between said wiring patterns at a first distance from said adjacent wiring patterns, said conductive dummy patterns being formed singly and continuously in a direction perpendicular to said wiring patterns, wherein said wiring patterns include first adjacent wiring patterns having a first wiring interval and a second adjacent wiring pattern having a second wiring interval said second wiring interval being different from said first wiring interval and wherein said conductive dummy patterns include first conductive dummy patterns formed between said first adjacent wiring patterns and second conductive dummy patterns formed between said second adjacent wiring pattern, and said first distance for said first conductive dummy patterns is substantially equal to said first distance for said second conductive dummy patterns.

14. The semiconductor device according to claim 13, wherein a characteristic of capacitance between said adjacent wiring patterns includes a first region where the value of capacitance between the adjacent wiring patterns greatly changes in response to changes in a distance of a dielectric region between the adjacent wiring patterns and a second region where the value of capacitance changes are less than in the first region, and said first distance corresponds to a minimum distance in said second region.

15. The semiconductor device according to claim 13, wherein a characteristic of capacitance between said adjacent wiring patterns includes a first region where the value of capacitance between the adjacent wiring patterns greatly changes in response to changes in a distance of a dielectric region between the adjacent wiring patterns and a second region where the value of capacitance changes are less than in the first region, and said first distance corresponds to a predetermined distance in said first region.

16. The semiconductor device according to claim 13, wherein a characteristic of capacitance between said adjacent wiring patterns includes a first region where the value of capacitance between the adjacent wiring patterns greatly changes in response to changes in a distance of a dielectric region between the adjacent wiring patterns and a second region where the value of capacitance changes are less than in the first region, wherein said plurality of conductive dummy patterns includes third conductive dummy patterns for which said first distance corresponds to a minimum distance in said second region, and fourth conductive dummy patterns for said first distance corresponds to a predetermined distance in said first region.

* * * * *